(12) United States Patent
Goyal et al.

(10) Patent No.: US 9,735,549 B2
(45) Date of Patent: Aug. 15, 2017

(54) METHODS FOR FORMING PHOTONIC INTEGRATED CIRCUITS BASED ON QUANTUM CASCADE STRUCTURES

(71) Applicants: Massachusetts Institute of Technology, Cambridge, MA (US); Pendar Technologies, LLC, Cambridge, MA (US)

(72) Inventors: Anish K. Goyal, Cambridge, MA (US); Laurent Diehl, Somerville, MA (US); Christian Pfluegl, Medford, MA (US); Christine A. Wang, Bedford, MA (US); Mark Francis Witinski, Cambridge, MA (US)

(73) Assignees: Massachusetts Institute of Technology, Cambridge, MA (US); Pendar Technologies, LLC, Cambridge, MA (US)

( * ) Notice: Subject to any disclaimer, the term of this patent is extended or adjusted under 35 U.S.C. 154(b) by 0 days.

(21) Appl. No.: 15/221,402

(22) Filed: Jul. 27, 2016

(65) Prior Publication Data

US 2017/0063043 A1    Mar. 2, 2017

Related U.S. Application Data

(62) Division of application No. 13/951,240, filed on Jul. 25, 2013, now Pat. No. 9,450,053.

(Continued)

(51) Int. Cl.
*H01L 29/06* (2006.01)
*H01S 5/34* (2006.01)
(Continued)

(52) U.S. Cl.
CPC ............ *H01S 5/3402* (2013.01); *B82Y 20/00* (2013.01); *H01L 29/15* (2013.01); *H01S 5/026* (2013.01);
(Continued)

(58) Field of Classification Search
CPC ...................................................... H01L 29/15
(Continued)

(56) References Cited

U.S. PATENT DOCUMENTS 4,521,443 A   6/1985   Naik et al.
4,684,971 A   8/1987   Payne
(Continued)

FOREIGN PATENT DOCUMENTS

WO    WO 03/049243 A2   6/2003

OTHER PUBLICATIONS

D. G. Deppe and N. Holonyak Jr., "Atom diffusion and impurity-induced layer disordering in quantum well III- V semiconductor heterostructures", Journal of Applied Physics 64, R93 (1988).*
(Continued)

*Primary Examiner* — Caleb Henry
(74) *Attorney, Agent, or Firm* — Hamilton, Brook, Smith & Reynolds, P.C.

(57) ABSTRACT

Photonic integrated circuits (PICs) are based on quantum cascade (QC) structures. In embodiment methods and corresponding devices, a QC layer in a wave confinement region of an integrated multi-layer semiconductor structure capable of producing optical gain is depleted of free charge carriers to create a low-loss optical wave confinement region in a portion of the structure. Ion implantation may be used to create energetically deep trap levels to trap free charge carriers. Other embodiments include modifying a region of a passive, depleted QC structure to produce an active region capable of optical gain. Gain or loss may also be modified (Continued)

by partially depleting or enhancing free charge carrier density. QC lasers and amplifiers may be integrated monolithically with each other or with passive waveguides and other passive devices in a self-aligned manner. Embodiments overcome challenges of high cost, complex fabrication, and coupling loss involved with material re-growth methods.

17 Claims, 9 Drawing Sheets

Related U.S. Application Data

(60) Provisional application No. 61/675,864, filed on Jul. 26, 2012, provisional application No. 61/782,639, filed on Mar. 14, 2013.

(51) Int. Cl.
  *H01L 29/15* (2006.01)
  *H01S 5/026* (2006.01)
  *H01S 5/20* (2006.01)
  *B82Y 20/00* (2011.01)
  *H01S 5/30* (2006.01)
  *H01S 5/227* (2006.01)

(52) U.S. Cl.
  CPC .......... *H01S 5/2018* (2013.01); *H01S 5/2063* (2013.01); *H01S 5/3013* (2013.01); *H01S 5/2275* (2013.01)

(58) Field of Classification Search
  USPC .............................................. 257/9; 438/478
  See application file for complete search history.

(56) References Cited

U.S. PATENT DOCUMENTS

| | | | |
|---|---|---|---|
| 4,840,816 A | 6/1989 | Appleton et al. | |
| 5,061,642 A | 10/1991 | Fujioka | |
| 5,204,870 A * | 4/1993 | Faist | B82Y 20/00 372/45.01 |
| 5,238,868 A | 8/1993 | Elman et al. | |
| 5,719,891 A * | 2/1998 | Jewell | G02B 3/00 257/13 |
| 5,832,019 A * | 11/1998 | Paoli | B82Y 20/00 372/46.016 |
| 7,623,745 B2 * | 11/2009 | Podolskiy | B82Y 20/00 385/123 |
| 7,826,509 B2 * | 11/2010 | Belkin | B82Y 20/00 372/20 |
| 8,895,335 B1 * | 11/2014 | Wierer, Jr. | H01L 31/035236 257/61 |
| 8,995,483 B2 * | 3/2015 | Diehl | H01S 5/0612 372/34 |
| 9,001,858 B1 * | 4/2015 | Hirayama | H01S 5/3425 372/45.012 |
| 9,368,677 B2 * | 6/2016 | Wierer, Jr. | H01L 21/0242 |
| 9,450,053 B2 | 9/2016 | Goyal et al. | |
| 2002/0034204 A1 * | 3/2002 | Iwamoto | H01S 5/22 372/46.01 |
| 2002/0136252 A1 * | 9/2002 | Capasso | B82Y 20/00 372/44.01 |
| 2003/0231686 A1 | 12/2003 | Liu | |
| 2005/0018721 A1 * | 1/2005 | Kish, Jr. | B82Y 20/00 372/20 |
| 2005/0069004 A1 * | 3/2005 | Watanabe | B82Y 20/00 372/49.01 |
| 2005/0213627 A1 * | 9/2005 | Masselink | B82Y 20/00 372/45.011 |
| 2005/0249473 A1 | 11/2005 | Page et al. | |
| 2006/0165143 A1 * | 7/2006 | Ohno | B82Y 20/00 372/46.015 |
| 2006/0215720 A1 | 9/2006 | Corzine et al. | |
| 2007/0098031 A1 * | 5/2007 | Yang | B82Y 20/00 372/45.012 |
| 2007/0248131 A1 * | 10/2007 | Botez | B82Y 20/00 372/43.01 |
| 2008/0219312 A1 * | 9/2008 | Sugiyama | B82Y 20/00 372/46.01 |
| 2008/0219628 A1 * | 9/2008 | Podolskiy | B82Y 20/00 385/123 |
| 2008/0273565 A1 * | 11/2008 | Gmachl | B82Y 20/00 372/45.012 |
| 2009/0052488 A1 * | 2/2009 | Sugiyama | B82Y 20/00 372/45.012 |
| 2010/0073110 A1 * | 3/2010 | Nathan | B82Y 20/00 333/218 |
| 2010/0142568 A1 * | 6/2010 | Arimoto | G02F 1/3133 372/20 |
| 2010/0272133 A1 * | 10/2010 | Kato | H01S 5/06256 372/20 |
| 2011/0024721 A1 * | 2/2011 | Edamura | B82Y 20/00 257/13 |
| 2011/0090928 A1 * | 4/2011 | Kaida | H01S 5/2226 372/46.012 |
| 2012/0044964 A1 * | 2/2012 | Yang | B82Y 20/00 372/45.01 |
| 2012/0201263 A1 * | 8/2012 | Botez | B82Y 20/00 372/45.01 |
| 2012/0230358 A1 * | 9/2012 | Botez | B82Y 20/00 372/45.01 |
| 2012/0236889 A1 * | 9/2012 | Caneau | B82Y 20/00 372/45.01 |
| 2012/0236890 A1 * | 9/2012 | Caneau | B82Y 20/00 372/45.01 |
| 2013/0240737 A1 * | 9/2013 | Caneau | H01S 5/06258 250/341.8 |
| 2014/0027708 A1 * | 1/2014 | Goyal | H01L 29/15 257/9 |
| 2015/0079770 A1 * | 3/2015 | Wierer, Jr. | H01L 21/0242 438/479 |

OTHER PUBLICATIONS

O. Kjebon, S. Lourdudoss, B. Hammarlund, S. Lindgren, M. Rask, P. Ojala, G. Landgren, and B. Broberg "1.55 µm buried heterostructure laser via regrowth of semi-insulating InP:Fe around vertical mesas fabricated by reactive ion etching using methane and hydrogen" Applied Physics Letters 59, 253 (1991).*

Boudinov, H., "Electrical Isolation of n-type InP by Ion Bombardment: Dose Dependence and Thermal Stability," *Nuclear Instruments and Methods in Physics Research*, B 175-177: 235-240 (2001).

Boudinov, H., et al., "Electron Isolation of n-Type InP by Ion Bombardment: Dose Dependence and Thermal Stability", *Nuclear Instruments and Methods in Physics Research Section B: Beam Interactions With Materials and Atoms*, 175-177: 235-240 (2011).

Coldren, L. A., et al., "Improved Functionality and Performance in Photonic Integrated Circuits", *Proc. Indium Phosphide and Related Materials (IPRM)*, Princeton, NJ, paper PLE1: 6 pages (May 2006).

Faugeras, C., et al., "High-Power Room Temperature Emission Quantum Cascade Lasers at $\lambda = \mu m$," *IEEE Journal of Quantum Electronics*, 41(12): 1430-1438 (2005).

Gasparoto, A., et al., "High-Resistance Buried Layers by MeV Fe Implantation in n-Type InP," *Applied Physics Letters*, 75(5): 668-670 (1999).

Gmachl, C., et al., "Single-Mode, Tunable Distributed-Feedback and Multiple-Wavelength Quantum Cascade Lasers," *IEEE Journal of Quantum Electronics*, 38(6): 569-581 (2002).

Hsu, C. F., et al., "Intersubband Quantum-Box Semiconductor Lasers", *IEEE Journal of Selected Topics in Quantum Electronics*, 6(3): 491-503 (2000).

International Preliminary Report on Patentability dated Jan. 27, 2015 for International Application No. PCT/US2013/052097 entitled "Photonic Integrated Circuits Based on Quantum Cascade Structures".

(56) References Cited

OTHER PUBLICATIONS

International Search Report and the Written Opinion of the International Searching Authority mailed Nov. 4, 2013 for International Application No. PCT/US2013/052097, entitled Photonic Integrated Circuits Based on Quantum Cascade Structures.

Lyakh, A., et al., "Intersubband Absorption of Quantum Cascade Laser Structures and Its Application to Laser Modulation", *Applied Physics Letters*, 92: 211108, 3 pages (2008).

Page, H., et al., "Improved CW Operation of GaAs-Based QC Lasers: $T_{max}$ = 150 K," *IEEE Journal of Quantum Electronics*, 40(6): 665-672 (2004).

Semtsiv, M.P., et al., "Proton-Implanted Shallow-Ridge Quantum-Cascade Laser," *IEEE Journal of Quantum Electronics*, 42(5):490-493 (2006).

Wan, J. Z., et al., "Ion Implantation Induced Compositional Intermixing in the InGaAs/InP MQW System for Wavelength Shifted Guidelines," *Nuclear Instruments and Methods in Physics Research*, B 106: 461-465 (1995).

Weinold, M., et al., "Fe-Implantation for Rear-Facet Coatings of InP-Based Quantum Cascade Lasers", *Electronics Letters*, 44(4): 2 pages (2008).

Wienold, M., et al., "Fe-Implantation for Rear-Facel Coatings of InP-Based Quantum Cascade Lasers," *Electronic Letters*, 44(4) (2008).

\* cited by examiner

1: Single-Schedule Proton Implantation

1. Completed QCL epitaxial structure

2. Remove plasmon/contact layers
3. Deep H⁺ implant

2: Multiple-Schedule Fe Implantation

1. Grow partial QCL epitaxial structure
2. First Fe implant

3. Re-grow upper layers
4. Remove plasmon/contact layers
5. Second Fe⁺ implant and anneal

#3: Fe Implantation plus Fe:InP Regrowth

1. Grow partial QCL epitaxial structure
2. First Fe implant

3. Re-grow upper layers
4. Remove upper layers from passive waveguide
5. Re-grown Fe:InP for upper cladding

#4: Fe Implantation plus Proton Implantation

1. Grow partial QCL epitaxial structure
2. First Fe implant

3. Re-grow upper layers
4. Remove plasmon/contact layers
5. Proton implant

METHODS FOR FORMING PHOTONIC INTEGRATED CIRCUITS BASED ON QUANTUM CASCADE STRUCTURES

RELATED APPLICATION(S)

This application is a divisional of U.S. application Ser. No. 13/951,240, filed Jul. 25, 2013, which claims the benefit of U.S. Provisional Application No. 61/675,864, filed on Jul. 26, 2012, and U.S. Provisional Application No. 61/782,639, filed on Mar. 14, 2013. The entire teachings of the above applications are incorporated herein by reference.

GOVERNMENT SUPPORT

The invention described herein was developed jointly by MIT Lincoln Laboratory and Eos Photonics under Navy STTR program N11A-011-0089. The government has certain rights in the invention.

BACKGROUND

Photonic integrated circuits (PICs) based on near-infrared (NIR) light include active and passive portions of a single chip and are used to produce off-the-shelf integrated devices. NIR PICs typically incorporate diode lasers, which are bipolar devices that utilize interband transitions between the valence and conduction bands. Diode lasers consist of both n- and p-type layers, and the emission wavelength is directly related to the bandgap of the active regions in the semiconductor structure. PICs that utilize diode lasers may be fabricated by increasing a bandgap of one or more semiconductor layers to minimize inter-band transitions in a passive waveguide region. Alternatively, NIR PICs may be fabricated by etching away the original waveguide from a region intended to be passive, followed by regrowing new layers having a larger bandgap than the laser wavelength and a low free-carrier concentration.

In contrast to diode lasers, quantum cascade lasers (QCLs) and other quantum cascade (QC) devices are unipolar devices that utilize intra-band transitions between subbands within the conduction band. The emission photon energy is significantly lower than the energy bandgap of the semiconductor materials that comprise the QC structure. QC devices do not rely on inter-band transitions, and they typically do not utilize two different types of doping (n- and p-type).

SUMMARY

Fabrication methods that have been used for near infrared (NIR) photonic integrated circuits (PICs) are inapplicable or undesirable as to quantum cascade (QC) structures. For example, increasing the bandgap energy between a conduction band and a valence band does not necessarily prevent inter-subband transitions and accompanying losses within the conduction band for QC structures. Moreover, NIR PICs fabricated by increasing the bandgap in the passive portion still suffer from losses due to free-carrier absorption in the n- and p-doped layers of the passive portion.

Further, the etching and re-growth method of creating PICs in the NIR is very difficult to implement and, therefore, costly. Also, it is difficult to achieve low optical coupling losses between the active and passive waveguide portions because of potential mismatches in layer thicknesses and compositions.

The present invention relates to PICs based on QC structures, as well as to corresponding methods of integrating QCLs and other QC-structure-based active devices with each other or with passive waveguides and other passive devices. Low optical losses may be achieved by significantly reducing a density of free charge carriers in at least one layer forming a QC structure. Depletion of free charge carriers may be accomplished by implanting ions into a QC structure where it is desired to be passive. Low electrical conductivity may also result from implanting the ions.

In a first embodiment, a device includes an integrated multi-layer semiconductor structure with active and passive portions. The structure includes a wave confinement region that includes a quantum cascade (QC) layer, and the wave confinement region extends into the active and passive portions of the multi-layer structure. The QC layer in the wave confinement region in the active portion of the structure has a density of free charge carriers sufficient to produce optical gain in a wavelength spectrum. The QC layer in the wave confinement region in the passive portion of the structure is substantially devoid of free charge carriers and has low loss in the same wavelength spectrum. Other layers of the structure, whether inside or outside the wave confinement region of the structure, can likewise be substantially devoid of free charge carriers for lower loss.

The QC layer can be substantially devoid of free charge carriers due to ions implanted therein. Implanted ions can include, for example, ions of Hydrogen, Iron, Helium, Oxygen, Chromium, Cobalt, Nickel, Titanium, Vanadium, Silicon, Sulfur, Selenium, Tellurium, Tin, Zinc, and Carbon. Alternatively, diffused atoms may be included in the QC layer, and the QC layer's quality of being substantially devoid of free charge carriers in the wave confinement region in the passive portion of the structure may be a consequence of the diffused atoms. Example densities of free charge carriers in the QC layer in the passive portion include densities less than about $10^{15}$ cm$^{-3}$ and densities less than about $10^{10}$ cm$^{-3}$. Where substantially devoid of carriers, the QC layer can include energetically deep trap levels, and these trap levels can result in the structural quality of being substantially devoid of free charge carriers. Alternatively, atoms can compensate for a free carrier concentration. Atoms can be diffused atoms, for example. The passive portion of the multi-layer structure can be or include a waveguide, a router, a splitter, a combiner, a coupler, a phase shifter, a multiplexer, an interferometer, a filter, a modulator, a switch, or a resonator, for example.

In turn, the active portion of the structure can be or include a laser, a distributed feedback laser, an amplifier, a master-oscillator power amplifier, a switch, a modulator, a phase shifter, or a detector, for example. The active portion can be active, for example, in the mid-infrared wavelength spectrum, and the passive portion can be passive in the same spectrum. In this description, the mid-infrared wavelength spectrum is considered to be between approximately 3 and 20 microns.

In a second embodiment, a method includes forming an integrated multi-layer semiconductor structure including a wave confinement region including a quantum cascade layer with a density of free charge carriers sufficient to produce optical gain in a wavelength spectrum. The method also includes configuring a portion of the wave confinement region to be a passive portion having low loss in the wavelength spectrum by substantially depleting at least the QC layer in the portion of free charge carriers. A remaining portion of the wave confinement region other than the passive portion comprises an active portion of the wave confinement region. The wavelength spectrum for optical activity or passivity can be in the mid-infrared, for example.

Ions can be implanted into the passive portion to substantially deplete the passive portion of free charge carriers. The ions can include ions of, for example, Hydrogen, Iron, Helium, Oxygen, Chromium, Cobalt, Nickel, Titanium, Vanadium, Silicon, Sulfur, Selenium, Tellurium, Tin, Zinc, and Carbon. Depletion of free charge carriers can extend to carrier densities of less than about $10^{15}$ cm$^{-3}$, or less than about $10^{10}$ cm$^{-3}$, for example. As one alternative to ion implantation, atoms may be diffused into the passive portion to carry out the depletion.

The passive portion of the wave confinement region can be configured to include deep trap levels to trap the free charge carriers. Alternatively, the portion is converted to a passive portion by introducing ions to compensate for the initial free-carriers and result in a net reduction in the free-carrier concentration.

The multi-layer structure can have active and passive portions corresponding, respectively, to the active and passive portions of the wave confinement region. The active portion of the structure can be or include a laser, a distributed feedback laser, an amplifier, a master-oscillator power amplifier, a switch, a modulator, a phase shifter, or a detector, for example. The passive portion of the multi-layer structure can be or include a waveguide, a router, a splitter, a combiner, a coupler, a phase shifter, a multiplexer, an interferometer, a filter, a modulator, a switch, or a resonator, for example.

Additional layers such as substrate, lower cladding, and upper cladding can also be formed as part of the multi-layer structure. Further, other layers such as waveguiding, plasmon, and contact layers can be formed. Where a contact layer is formed, it may be formed following forming the upper cladding layer, for example. A part of the contact layer in the passive portion of the structure can be removed by etching, for example, and a low-loss dielectric material can optionally be deposited onto the structure to replace all or part of the removed layer. In addition to the contact layer, a part of the upper cladding layer in the passive portion of the structure may also be removed, and a low-loss semiconductor material can be grown to replace all or part of the removed layers.

Protons or other ions can be implanted into other layers of the structure other than the quantum cascade layer. Lower cladding and upper cladding layers in the passive portion of the multi-layer structure, for example, may be ion-implanted to deplete free charge carriers and reduce optical losses due to those layers. Ion implantation may be performed in stages, and these stages may be interspersed with stages of structure formation. For example, ions can be implanted into the lower cladding and quantum cascade layers in the passive portion of the structure, followed by forming the upper cladding and contact layers. For example, one ion implantation stage can be completed after forming the lower cladding and quantum cascade layers, and additional ions may be implanted after forming the upper cladding and/or contact layers.

In a third embodiment, a method includes forming an integrated multi-layer semiconductor structure having a wave confinement region including a quantum cascade layer formed to be substantially devoid of free charge carriers and have low loss in a wavelength spectrum. The method also includes configuring a portion of the wave confinement region to be an active portion by increasing a density of free charge carriers in the QC layer in the portion of the wave confinement region to a value sufficient to produce optical gain in the layer in the wavelength spectrum. A remaining portion of the wave confinement region other than the active portion is a passive portion of the wave confinement region.

The multi-layer structure can include one or more of the passive devices listed for the embodiments summarized above, for example. Further, the active portion of the wave confinement region can correspond to an active portion of the structure, which can be configured to be operable as one or more of the active devices summarized above. Increasing the density of free charge carriers can include ion implantation or atom diffusion, for example.

In a fourth embodiment, a method includes forming an integrated multi-layer semiconductor structure including a wave confinement region having a QC layer, the wave confinement region having first and second portions with an initial density of free charge carriers in the QC layer. The method also includes modifying the initial density of free charge carriers in the QC layer in the second portion of the wave confinement region to be substantially different from the initial density. Modifying the initial density can include raising or lowering the initial density, and this can be done by ion implantation, for example.

The initial density of free charge carriers can be sufficiently low that the formed first and second portions of the wave confinement region are passive in a wavelength spectrum, and the initial density can be increased in the second portion to a level sufficient to produce optical gain in the QC layer in the portion in the wavelength spectrum. Alternatively, the initial density can be high enough to produce optical gain in the QC layer, and the initial density can be decreased in the second portion to a level low enough to render the second portion passive, for example.

As a third alternative, the initial density of free charge carriers can be sufficiently high to produce an initial optical gain in the QC layer, and the density can be modified enough to be able to produce a modified level of optical gain in the second portion, the modified gain differing substantially from the initial gain. The third alternative can be used, for example, where the first portion includes a quantum cascade laser gain medium and the density is modified in the second portion to render the QC layer in the second portion operable as a quantum cascade amplifier gain medium with a gain that differs from that of the quantum cascade laser gain medium.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1A:
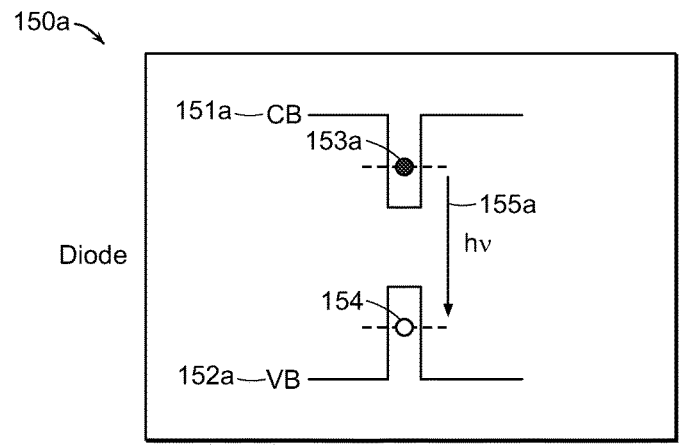
FIGS. 1A and 1B show schematic energy band diagrams for diode and quantum cascade structures, respectively.

A description of example embodiments of the invention follows.

The teachings of all patents, published applications and references cited herein are incorporated by reference in their entirety.

For simplicity, the term quantum cascade (QC) structure is used in some of the descriptions that follow. It should be understood that QC or QC structure should be interpreted generally to be a multi-layer structure that is a source of radiation, typically mid-infrared (MIR) radiation, that comprises a quantum-cascade (QC) layer and could refer to a laser, an amplifier, or any other active QC structure capable of QC-type gain given a high enough density of free charge carriers present in the QC layer. Also, a "QC layer" may have many sublayers, even hundreds of sublayers, for example.

Furthermore, emphasis herein is placed on Indium phosphide (InP)-based QC lasers and other QC structures since these are the most common type. However, the discussion is equally applicable to QC devices based on other semiconductor material systems, such as Gallium Arsenide (GaAs), Gallium Antimonide (GaSb), and so forth.

In the descriptions that follow, "concentration" may be used interchangeably with "density" as to free charge carriers and implanted ions. Both "concentration" and "density" may be used to denote a number of free charge carriers or implanted ions per unit volume.

In the descriptions that follow, "cladding" is used to denote a material used to assist in confinement of the optical mode in a semiconductor structure. In some embodiments, a cladding layer is adjacent to an active QC layer, while in other embodiments, the cladding layer is not adjacent to the QC layer, and there can be one or more intermediate layers such as waveguiding layers.

Photonic Integrated Circuits

Photonic integrated circuits (PICs) are very important off-the-shelf components for optical telecommunication. In general, these devices are composed of several integrated elements with different functionalities (such as lasers, amplifiers, detectors, wavelength combiners, power splitters, modulators, couplers, switches, low-loss Bragg reflectors, and so forth) fabricated monolithically on a single semiconductor wafer. Passive waveguides, or regions with low optical losses, are essential to the realization of PICs since they connect the different on-chip elements, for example. PICs have been developed so far almost exclusively at telecommunication wavelengths, i.e., at $\lambda \sim 1.55$ µm on InP or silicon-on-insulator (SOI) wafers.

Diode Laser PICs and Traditional Methods for Fabricating PICs

Diode lasers are bipolar devices that utilize interband transitions between the valence and conduction bands. Their emission wavelength is in general in the near-infrared (NIR), at wavelengths shorter than 3 µm. Diode lasers consist of both n- and p-type layers, and the emission wavelengths of a diode lasers is directly related to the bandgap of the active regions in the semiconductor structure. PICs that utilize diode lasers are usually fabricated by increasing the bandgap of one or more semiconductor layers to minimize the inter-band transitions since these usually result in optical absorption that is significantly larger than the free-carrier absorption component of the optical loss. Because free-carrier absorption depends on the square of the wavelength, this loss mechanism does not in general play a significant roll in NIR PICs compared to MIR PICs, for which the wavelength range is typically between 4 to 14 µm.

PICs based on diode lasers in the near-infrared (NIR) (see, e.g., Coldren et al., *Proc. Indium Phosphide and Related Materials (IPRM)*, paper PLE1, Princeton, N.J., May 7-11, 2006) generally rely on ion implantation to shift the bandgap (see, e.g., Wan et al., *Nucl. Instr. Meth. Phys. Res. B*, 106 461 (1995); Elman et al., U.S. Pat. No. 5,238,868 and the references therein). In this particular case, ion implantation and the subsequent thermal annealing of the sample results in quantum-well intermixing, or compositional disordering and intermixing of the two irradiated materials forming the barrier and the quantum wells of the heterostructure. This leads to a controllable and spatially selective increase of the energy bandgap in some layers of the implanted heterostructure compared to the bandgap of the unmodified material. This spatially selective increase of the energy bandgap is generally large enough to render a waveguide, or a region formed in the implanted region, relatively transparent to the light emitted by a laser formed from the un-implanted material due to a reduction in the inter-band absorption.

Another method of creating PICs in the NIR involves material regrowth, or etching away the original waveguide and re-growing new layers having a larger bandgap than the laser wavelength and also having a free-carrier density that is as low as possible to limit losses. This approach, however, is very difficult and costly to implement. A further problem with this approach is the difficulty of achieving low optical coupling losses between the laser and passive waveguide since any mismatch in layer thicknesses and compositions will result in an optical coupling loss.

FIG. 1A is a schematic energy band diagram 150$a$ for a diode laser. A semiconductor material represented in the diode diagram 150$a$ includes a conduction energy band 151$a$ containing an electron 153$a$ and a valence band 152$a$ containing a hole 154. A transition 155$a$ from the conduction band 151$a$ to the valence band 152$a$ gives rise to emission of a photon.

Mid-Infrared Photonic Integrated Circuits

QC gain devices such as QC lasers, in contrast to diode lasers, are unipolar devices that utilize intra-band transitions (or, equivalently, intersubband transitions) within the conduction band. The emission photon energies of QC structures are significantly lower (from ~88 meV to 310 meV, which corresponds to ~4 to 14 µm) than the energy bandgap of the semiconductor materials that comprise the QC structure. Unlike diode lasers, QC devices do not involve inter-band transitions nor two different types of doping (n- and p-type). The approach being disclosed in this application is applicable to light sources that are based on intra-band transitions. These light sources include QC light sources and other QC devices and can be MIR light sources.

The QC energy diagram 150b similarly contains a conduction band 151b, valence band 152b, and electron 153b. However, in the quantum cascade structure, the transition 155b giving rise to photon emission is between energy levels 156a and 156b that are both within the conduction band 151b. In the diagram 150b, it can be seen that there are two regions where the conduction and valence band edges 151b and 152b are closer together in energy. These two regions correspond to two layers of similar energy band properties within a QC structure, and the two similar layers are separated by a different layer with energy bandgaps that are greater. In general, a QC layer or structure will include many of these alternating layers, such as many hundreds, for example.

Figure 1B:
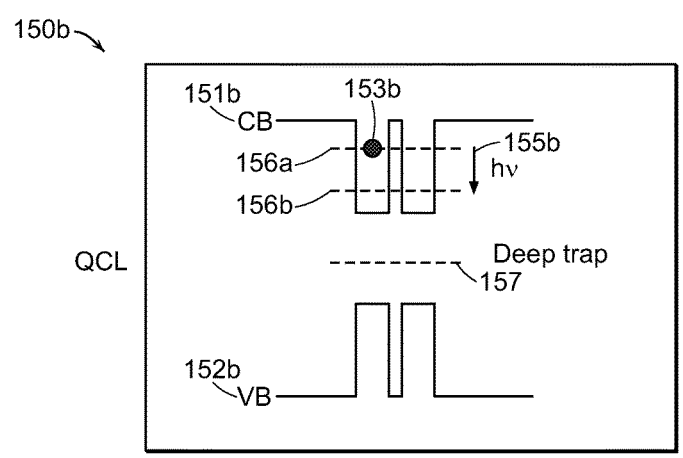

FIG. 1B shows a QC energy diagram 150b that also contains a deep trapping energy level 157 that can be created between the conduction and valence bands by, for example, ion implantation using ions such as Iron or Protons. The energetically deep trapping energy level 157 may also be referred to as a deep trap level. Deep trap levels are not applicable for monolithic integration of diode structures. However, the inventors have discovered that creating deep trap levels in QC structures by, for example, ion implantation, can result in QC-based PICs with low optical loss in the implanted regions.

The development of PICs in the MIR is very promising for a number of applications. An example of MIR PIC useful for spectroscopic applications such as gas sensing consists of a monolithic broadband laser source comprising an on-chip beam combiner integrated with passive low-loss waveguides and an array of MIR, single mode QC lasers (QCLs). Every laser element in this example QCL array would preferentially be a distributed feedback (DFB) QCL emitting at a different wavelength to form, as a whole, a broadband source having an emission spectrum overlapping with several absorption features of a gas mixture, for example. The purpose of the beam combiner is to combine the individual outputs of the different active QCL array elements into a single output to simplify the optics needed to collimate the laser source.

Another example is high-power applications such as infrared (IR) countermeasure. High-power applications would also benefit from the development of a similar integrated laser source. However, in the case of some high-power applications, each element in the laser array would be optimized for high output power instead of broadband spectral coverage.

Figure 2A:
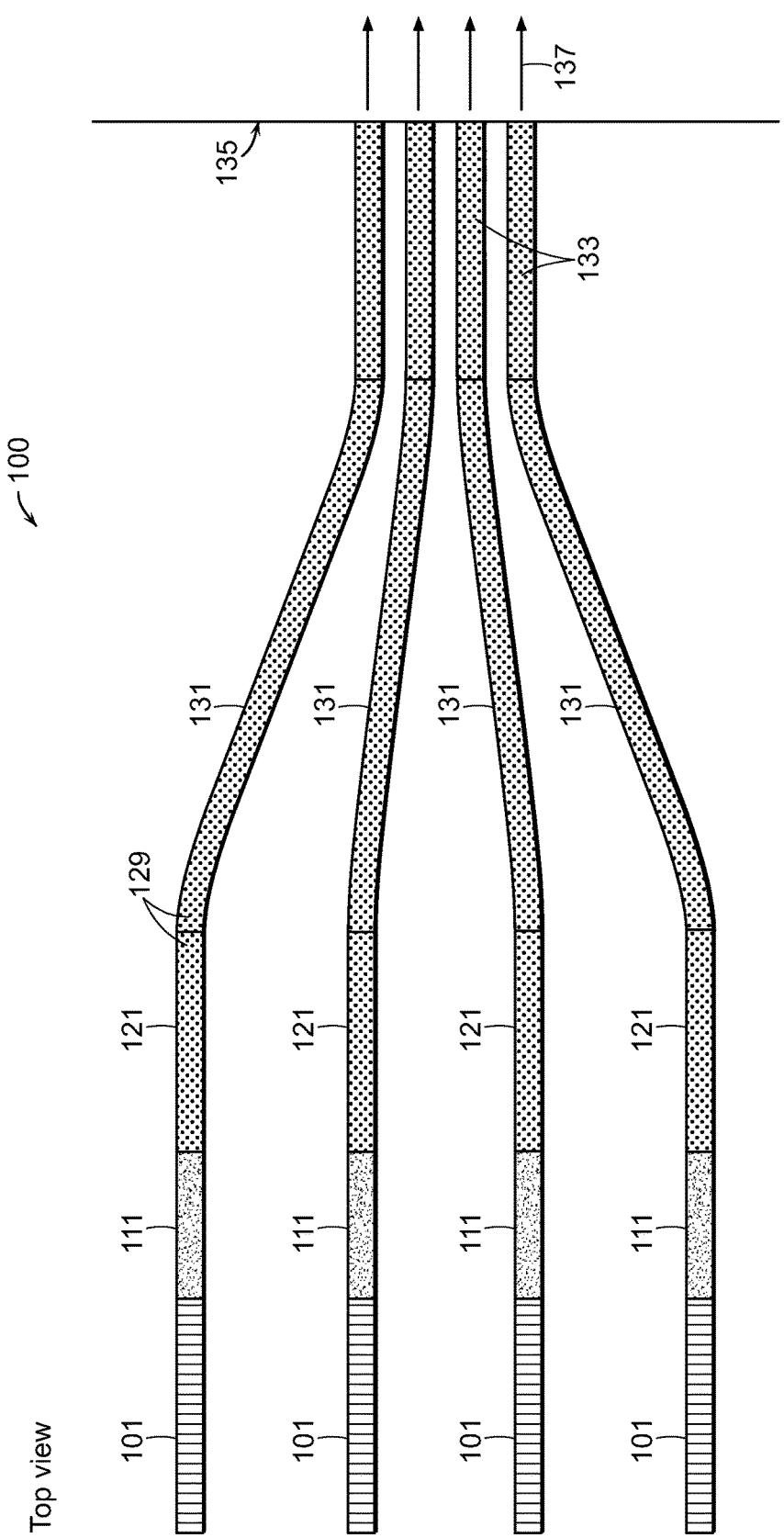
FIG. 2A is a top view of an example photonic integrated circuit based on quantum cascade structures.

FIG. 2A shows a top view of an example MIR PIC that includes an array of DFB QCLs 101 optically coupled to QC power amplifiers 111 in a master-oscillator power amplifier (MOPA) configuration. The outputs of the power amplifiers 111 are connected to low-loss waveguides 121, 131, and 133 that collectively form a router capable of bringing the multiple outputs in very close proximity to each other at an output interface 135. Outside of the output interface 135, the output beams 137 are still in close proximity, and the output beams 137 may overlap and/or be focused by additional optical elements (not shown) as required.

Ions 129 are implanted into the low-loss waveguides 121, 131, and 133. The implanted ions 129 substantially deplete a QC layer (not shown) in the waveguides 121, 131, and 133. As used in this application, "ions" or "implanted ions" refers to ionized atomic or molecular species that have been introduced into the semiconductor structure. The exact electronic nature of the ions, or whether they can still be considered "ions" once implanted is unimportant for purposes of this application. "Implanted ions" or "ions" simply refer to atoms that are introduced into the semiconductor structure after their initial growth.

The previously given examples represent only one class of PICs that would be enabled by the ability to integrate QC structures with passive waveguides. A range of other novel functionalities can be realized. Low-loss integrated optical elements and novel functionalities include, for example, phase shifters, arrayed waveguide multiplexers, optical routers, optical couplers, Mach-Zehnder interferometers, filters, modulators, switches, resonators, splitters, etc.

In the MIR wavelength region, the optical losses originate mainly from (i) free-carrier absorption in doped semiconductor layers and (ii) inter-subband absorption, i.e., optical transitions between electronic levels in quantum wells, if the waveguide includes a heterostructure. Unlike NIR diode lasers in QC structures, the bandgap of the semiconductor materials used to create the chip do not play a significant role in terms of optical losses. Both of the above types of losses are proportional to the free carrier concentration in the layers.

It is possible to fabricate low-loss MIR passive waveguides alongside active QC structures using the re-growth method described above, in which the original waveguide is etched away and replaced with new layers having a free-carrier concentration as low as possible to limit losses. The material for the cladding layers is preferentially Fe-doped InP since the Fe ions form deep traps for the electrons. This reduces by orders of magnitude the carrier concentration even at temperatures significantly above room temperature and transforms the layer into an electrically insulating and optically transparent region as long as the concentration of deep trap levels is higher than the background doping of InP. Similarly, the core of the passive waveguide is preferentially composed of a material that has a higher refractive index than InP, such as InGaAs or InAlAs, and also doped with an impurity such as Fe to compensate the background doping.

In terms of the fabrication steps required, this re-growth approach is very similar to the one used in NIR PICs—only the type of materials that are re-grown changes. This approach also suffers from the same disadvantages as it does for NIR PICs. In particular, it requires at least one extra-growth step, which adds significantly to the fabrication costs. Moreover, it is difficult to ensure that the two waveguide cores align at the junction between the QCL and the passive waveguide. This results in undesirable coupling losses when light transfers from the QCL to the passive waveguide.

Novel Method of Using Ion-Implantation to Fabricate MIR PICs

Embodiments of this invention can be based on the implantation of ions, preferentially protons (H) and/or Iron (Fe), into a passive portion of the QC structure to form a self-aligned, low-loss passive waveguide (or wave confinement region) for MIR PICs. The implanted ions create energetically deep traps in n-doped semiconductor layers that reduce the concentration of free charge carriers, or mobile electrons. An example of an energetically deep trapping level is deep trap level 157 shown in FIG. 1. Low optical losses and electrical insulation can be achieved by implanting enough ions to reduce the carrier concentration below the initial concentration to a level that is preferably $<\sim 10^{15}$ $cm^{-3}$.

Ion implantation was demonstrated experimentally to lead to significant reduction of electron concentration in both bulk semiconductor and heterostructures, in particular the gain medium of QCLs. The inventors have discovered that this method significantly facilitates the integration of passive photonic elements with active QC elements such as QCLs and QC amplifiers to create MIR PICs. This will be described in more detail in what follows.

Figure 2B:
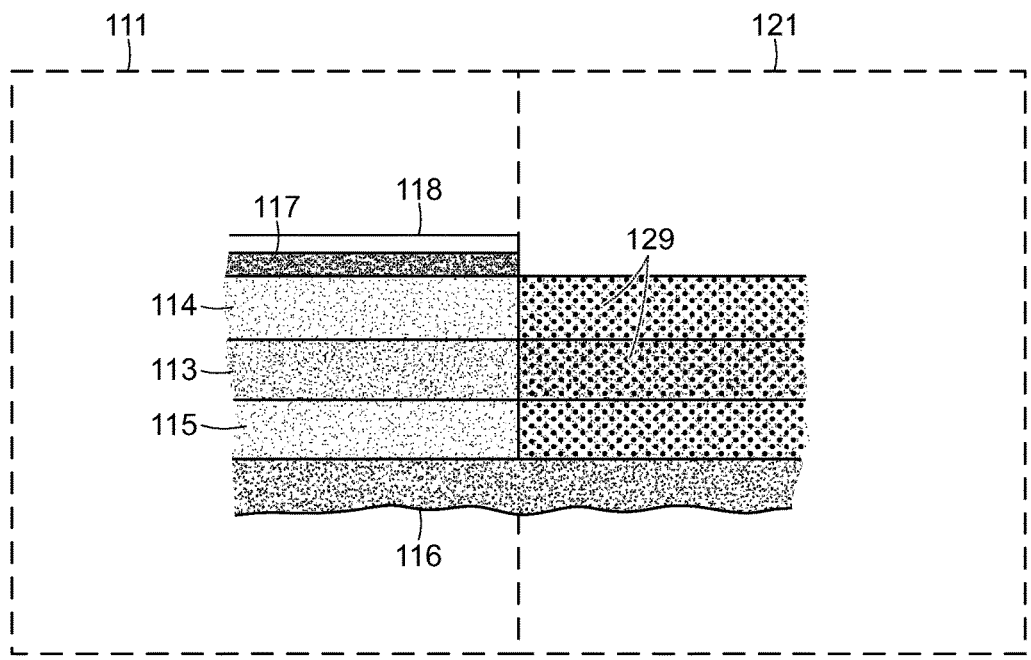
FIG. 2B is a schematic cross-sectional profile view of a junction between active and passive portions of the example photonic integrated circuit based on the quantum cascade structure.

FIG. 2B shows schematically a cross section of the junction between the power amplifier 111 and the passive waveguide 121 (also shown in FIG. 2A) after processing. Both integrated elements 111 and 121 are fabricated on a single substrate 116. In this embodiment, the light generated in the amplifier 111 travels from the left to the right of FIG. 2B. The active QC element 111 in general includes a QC layer 113, which acts as the waveguide core, and two cladding layers 114, 115 that are typically low-doped InP (doping level between: $1 \times 10^{16}$ cm$^{-3}$ and $5 \times 10^{17}$ cm$^{-3}$). Electrical connection to the active element 111 is provided by a highly doped InP layer 117 (doping: $1 \times 10^{18}$ cm$^{-3}$ or higher) and a metal contact 118.

The QC gain medium 113 may also be referred to as a QC layer or active layer. The gain medium 113 may include many sub-layers of alternating materials such as InGaAs and InAlAs or other alternating materials. It should be understood that reference to a QC layer or active layer can be used to refer to a grouping of such sub-layers. The active and passive elements 111, 121 can also be referred to, respectively, as active and passive portions of the multi-layer structure.

In this embodiment shown in FIG. 2B, the passive waveguide 121 includes the same cladding layers 114, 115 that form the waveguide of the active element 111, i.e., a waveguide core 113 and two cladding layers 114 and 115. The cladding layers 114 and 115 may also be referred to as upper and lower cladding layers, respectively. The only difference in the layers between the active and passive portions is that in the passive portion 121, the layers are implanted with ions 129, as symbolized by small dots.

Note that in this embodiment, the entire cladding layers are implanted. However, in other embodiments, the entirety of the cladding is not implanted, but only the portion that overlaps the waveguide mode, or wave confinement region. The wave confinement region is the region of the multi-layer structure where the supported optical mode is concentrated. For purposes of this disclosure, the wave confinement region is defined by the region in which optical intensity of a supported mode is greater than half of the peak intensity.

Also, note that the highly doped layer 117 and the metal contact 118 are not necessary on the passive waveguide portion of the multi-layer structure because the passive portion does not require electrical pumping. Because the layers 113, 114, 115 are ion implanted in the passive portion 121 of the structure, their electrical conductivity is very low, and the flow of electrical current is limited to the layers 113, 114, 115, 116, 117, and 118.

It should be noted that power amplifier 111 may also be called an "active portion" of the multi-layer semiconductor structure. Further, the multi-layer semiconductor structure that includes power amplifier 111 and passive waveguide 121 may be referred to herein as a "semiconductor" structure, even though it may include one or more conducting or partially conducting layers such as 117 and 118. Further, the quantum cascade layer 113 may still be referred to as a quantum cascade layer or structure, even if it is substantially devoid of free charge carriers or if it has been rendered substantially depleted of free charge carriers by, for example, ion implantation.

Figure 2C:
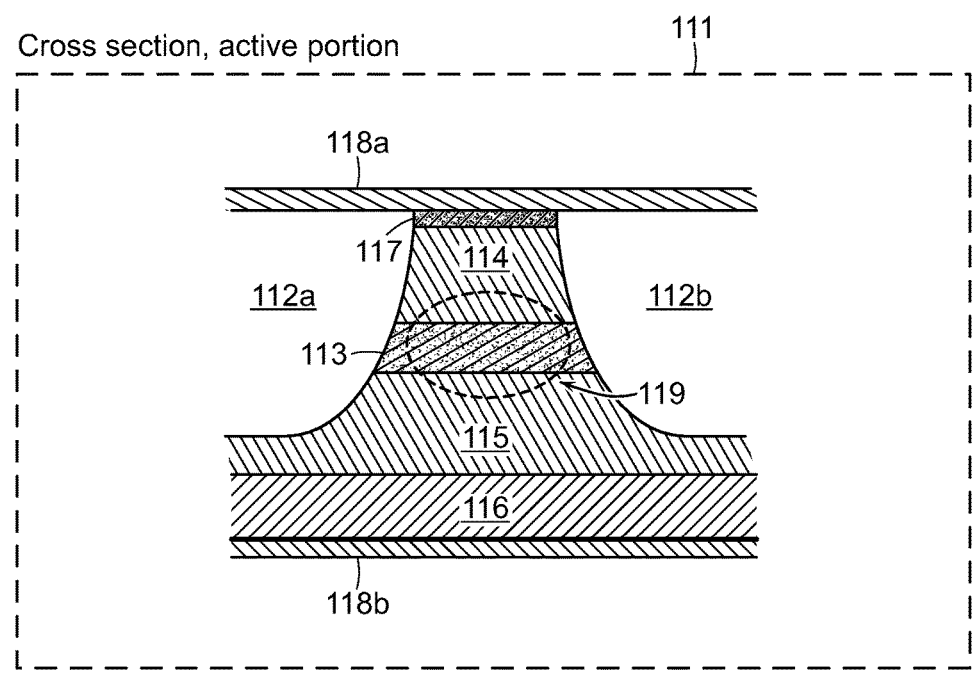
FIGS. 2C and 2D are schematic cross-sectional views of active and passive portions, respectively, of the example photonic integrated circuit based on the quantum cascade structure.

FIG. 2C shows a schematic cross section view through the power amplifier 111, which includes QC gain medium 113, two cladding layers 114, 115, as well as a highly doped contact and plasmon layer 117 grown on a substrate 116. Electrical connection to the active element 111 is provided by two metallic contacts 118a, 118b. The geometry of the active element 111 is preferably that of a buried QC heterostructure, i.e., an etched ridge (width between 3 µm and 25 µm) surrounded by two Fe-doped InP layers 112a, 112b, which provide electrical insulation and improve the lateral heat dissipation from the waveguide core 113. In certain embodiments, it may be desirable to replace the layers 112a, 112b with a thin insulator such as $Si_3N_4$ or $SiO_2$. The wave confinement region 119 is where a supported optical mode is concentrated, defined as the region of the optical mode within the points where the optical intensity of the supported mode is 50% of the maximum. The optical intensity of the supported mode is greatest in the center of the oval line 119, and oval line 119 marks the position where the optical intensity falls to 50% of the maximum.

Figure 2D:
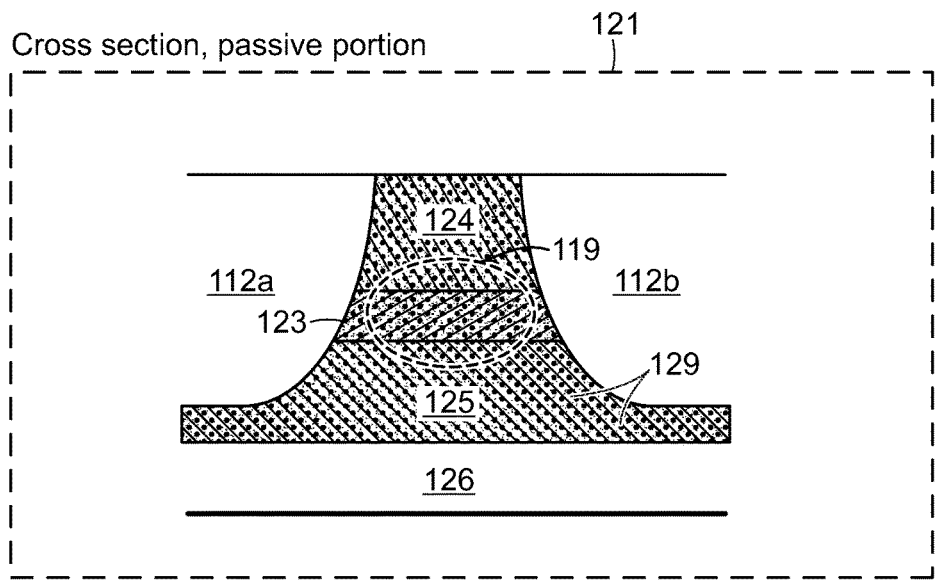

FIG. 2D shows a schematic cross section view through the passive waveguide 121, which includes a QC layer 123 and two cladding layers 124, 125 grown on a substrate 126. These layers are implanted with ions, 129 at a concentration sufficient to significantly reduce the free-carrier concentration. Note that the entirety of the cladding does not need to be implanted in some embodiments, but just the portion 119 in which the optical mode is concentrated. The geometry of this passive element 121 is preferably that of a buried QC heterostructure, i.e., an etched ridge (width between 1 µm and 25 µm) surrounded by two Fe-doped InP layers 112a, 112b.

Protons and Iron (Fe) are the preferred ions for implantation, but other ions are also possible. Fe implantation inserts Fe ions into the semiconductor structure, such that upon thermal annealing, the Fe ions are incorporated into the semiconductor's crystal lattice. Fe that is incorporated into the crystal lattice is known to result in a deep energy level at approximately 0.65 eV below the conduction band edge in InP. Fe also forms deep levels in the other materials that comprise a QC structure. With a sufficiently high concentration of incorporated Fe, the mobile electron concentration in InP can be reduced to $<10^{10}$ cm$^{-3}$.

The Fe ions are stable with respect to high-temperature processes that may subsequently occur during fabrication of the QC structure, such as a high-temperature material re-growth step. Other ions are also known to create deep electronic levels in the semiconductors that comprise a QC structure. These include, but are not limited to, the transition metals such as Cr, Co, Ni, Ti, and V. Protons, on the other hand, result in deep levels by damaging the semiconductor crystal lattice to create vacancies and other defects. These defects result in a range of trap energies that fall roughly between 0.1-0.3 eV below the conduction band edge. These deep traps are not as deep as those afforded by Fe, but are sufficiently deep to reduce the free charge carrier (or mobile carrier) concentration to levels that are useful for fabricating passive waveguides.

One limitation associated with using these damage-related defects for creating the passive waveguide is that the defects can be repaired via a thermal annealing process. Such annealing occurs at temperatures >~500 K such that subsequent processes in the fabrication of the MIR PIC should remain below this temperature. Nevertheless, this is still consistent with reliable operation of MIR PICs at temperatures up to at least 400 K. It should be noted that almost any ion can be used to create these damage-related deep levels. Proton implantation is particularly attractive because their low mass allows them to be implanted very deeply into the semiconductor.

Finally, it should be noted that there may be other physical processes besides those discussed above to create deep traps. The above discussion is not meant in any way to restrict the mechanism by which ion implantation can be used to create deep levels in the semiconductor layers that comprise the QC structure. It may, in fact, be necessary to implant multiple ion species to achieve the desired effects. Further, free charge carriers may be depleted by, for example, diffusing atoms into the semiconductor layers.

Embodiments of the invention disclosed herein are particularly attractive for the fabrication of passive waveguides integrated with active QC structures for several reasons. First, ion implantation allows the QC layer and cladding layers of a QC structure to be transformed into optically transparent and electrically insulating regions.

Second, the coupling losses between the QC structure and integrated passive waveguide are negligible because (i) the passive and the active portions of the wave confinement (or waveguide) region share the same lower cladding layer and QC layer, and possibly the same upper cladding layer and (ii) the refractive index difference between the implanted and the initially-doped layers is small. Third, ion implantation is inexpensive, reliable, compatible with the fabrication of QC structures, and requires only a minimal number of additional steps.

Related Prior Uses of Ion Implantation

Embodiments of the invention described herein rely on ion implantation, which is a well-known method used during the fabrication of a number of electronics and optoelectronic devices, mainly for the purpose of realizing passive waveguides or forming electrically insulating and/or conductive regions on a semiconductor chip. For example, in the method described in Naik et al., U.S. Pat. No. 4,521,443, nitrogen ions were implanted in a silicon dioxide substrate and annealed. In the regions where nitrogen was implanted, the interaction of the nitrogen ions with the silicon dioxide led to an increased refractive index, which can be used to produce an optical waveguide.

Similar methods based on ion implantation exist to fabricate waveguides in other material systems. For example, Ti ions can be used to produce optical waveguides in $LiNbO_3$ according to the method described in Appleton et al., U.S. Pat. No. 4,840,816.

Ion implantation is also used commonly to dope, i.e., to significantly increase the concentration of donors or acceptors, in specific regions of semiconductor devices in order to create regions with a specific conductivity type. Payne et al., U.S. Pat. No. 4,684,971, is an example of how ion implantation can be used to form n-type and p-type regions to create source and drain regions in CMOS field effect transistors and other devices.

Ion implantation is also frequently used to create an electrically insulating layer for inter-device isolation, dark-current reduction and other purposes. The method known as SIMOX (Separation by implanted Oxygen) consists of implanting oxygen ions in silicon and annealing the sample to form an insulating $SiO_2$ layer, as described, for example, in Fujioka, U.S. Pat. No. 5,061,642. This method is an example of a widely used technique to produce semiconductor on insulator (SOI) substrates, which are very important to modern electronics.

A different method to form an electrically insulating layer in a semiconductor device is to implant ions known to create deep electron or hole traps through, for example, the formation of crystal defects. Proton (H+) and Iron ions (Fe+) can, for instance, be used to create insulating layers in InP, as discussed in Boudinov et al., *Nucl. Instr. Meth. Phys. Res. B*, 175 235 (2001). The main effects of this type of implanted ions are to reduce the number of free carriers that can participate to an electrical current as well as to limit the mobility of the carriers. Both effects can lead to a significant increase in resistivity in the implanted region.

Ion implantation has been extensively used to shift the bandgap of semiconductor heterostructure as discussed, for example, in Wan et al., *Nucl. Instr. Meth. Phys. Res. B*, 106 461 (1995) and Elman et al., U.S. Pat. No. 5,238,868 and the references therein. In this particular case, ion implantation and the subsequent thermal annealing of the sample result in compositional disordering and intermixing of the two irradiated materials forming the barrier and the quantum wells of the heterostructure. The compositional disordering and intermixing lead to a controllable and spatially selective increase of the bandgap (blueshift) in some layers of the implanted heterostructure compared to the bandgap of the unmodified material as described previously. This blueshift is generally large enough to render a waveguide or a region formed in the implanted region transparent to the light emitted by a laser formed from the unimplanted material. This selective tuning technique is very important for monolithic PICs based on interband optical transitions, i.e., PICs consisting of elements such as diode lasers, photodiodes etc. as it allows the monolithic integration of transparent waveguides or other low-loss optical elements with active elements such as lasers, amplifiers, photodetectors etc.

Ion implantation has also been used in the past in the context of quantum cascade laser (QCL) technology. QCLs (see, e.g., C. Gmachl et al., IEEE *J. of Quantum Electron.* 38, 569 (2002) and the references therein) are the most widely used semiconductor laser sources in the MIR portion of the electromagnetic spectrum. However, proton implantation has been used as a means to confine current to specific regions of a QCL ridge by implanting the areas where current flow was not desired, as explained in detail in Page et al. IEEE *J. of Quantum Electron.* 40, 665 (2004), Faugeras et al., IEEE *J. of Quantum Electron.* 40, 665 (2004) and Semtsiv et al., IEEE *J. of Quantum Electron.* 42, 490 (2006). Similarly, Fe implantation was used to increase the electrical resistance near the QCL facet to allow deposition of metal coating without electrically shorting the device, as detailed in Wienold et al., *Electronics Lett.* 44, (2008). However, the ion implantation step only achieved making part of a QCL electrically insulating.

Ion implantation was also proposed in the context of QCL technology for the realization of Bragg gratings for single-mode operation as explained in, for example, Page et al., U.S. Patent Publication No. 2005/0249473 and Corzine et al., U.S. Patent Publication No. 2006/0215720 A1. In these implementations, the refractive index change necessary to form the Bragg grating is obtained by inducing a change in the carrier concentration in highly doped layer via ion implantation. This change in carrier concentration corresponds to a change in refractive index through the so-called plasma-resonance effect and can be large enough to obtain single-mode emission.

These ion-implantation methods applied to QCLs did not achieve creation of optically low-loss waveguide or wave confinement regions, nor was that their goal, and these prior methods are very different from embodiments of the invention disclosed herein.

Fabrication Processes

In this section, several possible methods for fabricating passive waveguides from a QC structure will be described.

Note that the specific processing steps described are representative of embodiment fabrication approaches and are not intended to limit the approaches that are possible for creating passive waveguides from QC material using ion implantation.

Figure 3:
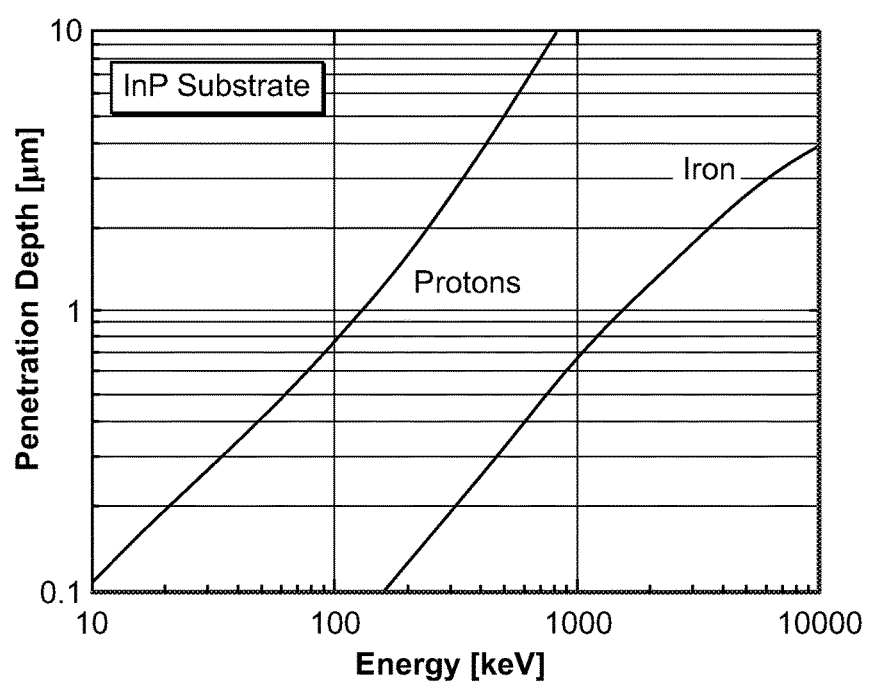
FIG. 3 is a graph that plots ion-implantation penetration depth of protons and Iron into Indium phosphide as calculated using software.

FIG. 3 shows a graph plotting and comparing ion-implantation penetration depth of protons and Fe ions into InP as calculated using the TRIM software (www.srim.org). The penetration depth into the other materials that comprise a QC structure (such as InGaAs and InAlAs for InP-based QC structures, or AlGaAs and InGaAs for GaAs-based QC structures) will be very similar to that for InP. FIG. 3 demonstrates that for a given implantation energy, protons penetrate much more deeply than Fe because of their lower mass. At an energy of 1 MeV, for example protons and Fe ions have a penetration depths of >10 µm and 0.6 µm, respectively. By increasing the implantation energy to 10 MeV (which is a value that is obtainable from some facilities within the U.S.), Fe can be implanted to a depth of up to about 4 µm.

Since a total thickness of a QC structure can be on the order of 10 µm, it can be seen from FIG. 3 that proton implantation can be used to convert the entire structure into an optically low-loss structure with no subsequent material re-growth steps. However, it is likely not possible to convert the entire QC structure using Fe implantation without subsequent material growth and additional implantation because of its limited penetration depth. An exception to this may be made possible through the use of channeling along particular crystal orientations, such as along the [100] direction, to increase the implantation depth beyond those calculated using TRIM.

In order to distribute the implanted ions approximately uniformly throughout the structure, multiple implants at different energies may be required. Multiple implants of different energies and doses performed during the same fabrication step will be termed an "implantation schedule."

Figure 4:
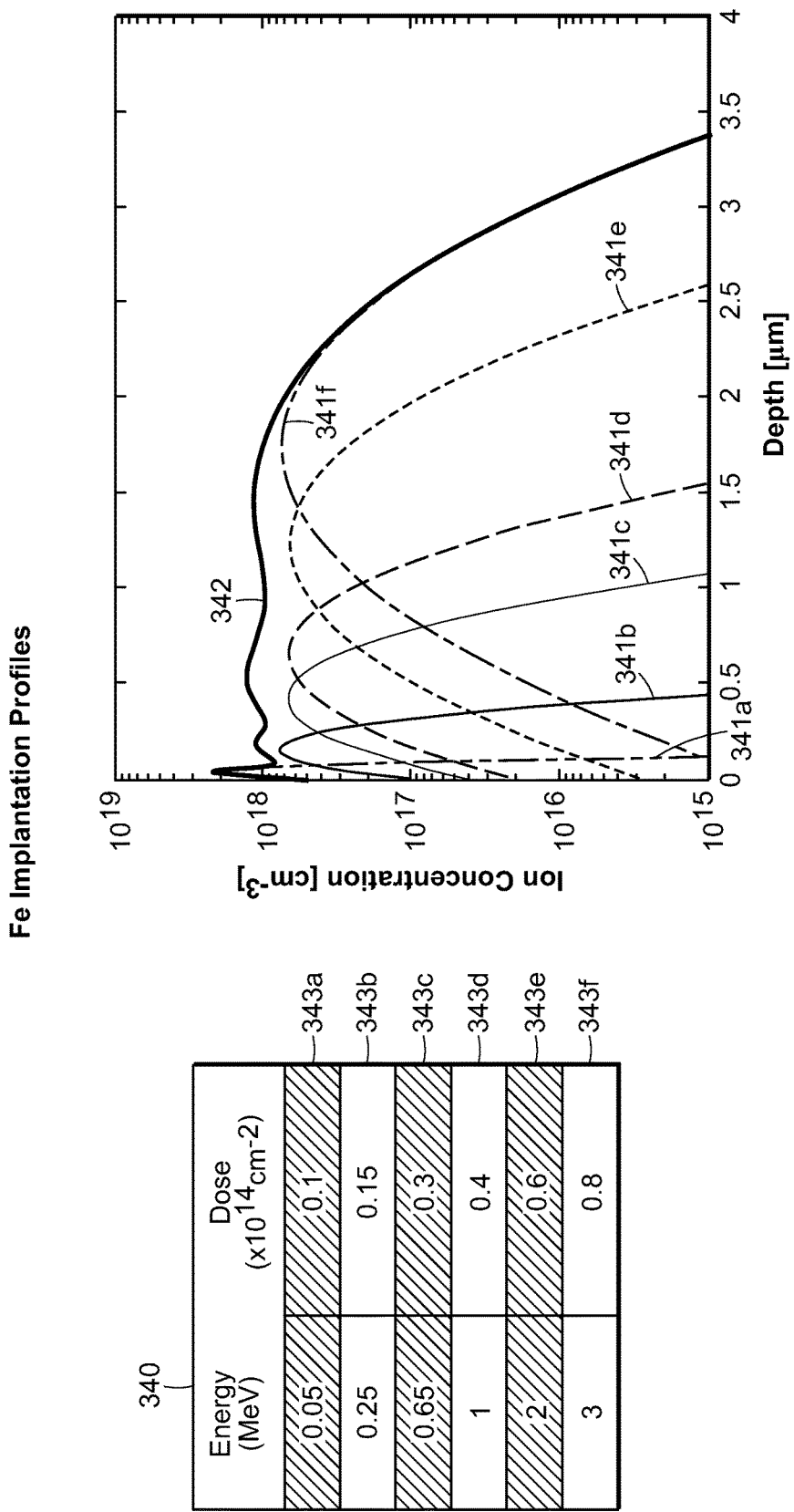
FIG. 4 shows an example implantation schedule for implanting Iron ions into Indium phosphide.

FIG. 4 shows a typical implantation schedule for implanting Fe such that its concentration in the InP is approximately ~$10^{18}$ cm$^{-3}$ from the surface to a depth of ~2 µm. This involves multiple implants, as shown in table 340. Individual doses 343a-f correspond to individual implantation profiles shown in curves 341a-f, ranging from 50 keV to 3 MeV in energy. In each implantation, the implantation dose is adjusted to achieve the approximately uniform overall profile 342. Similar considerations are involved when implanting protons or other ion species.

Figure 5:
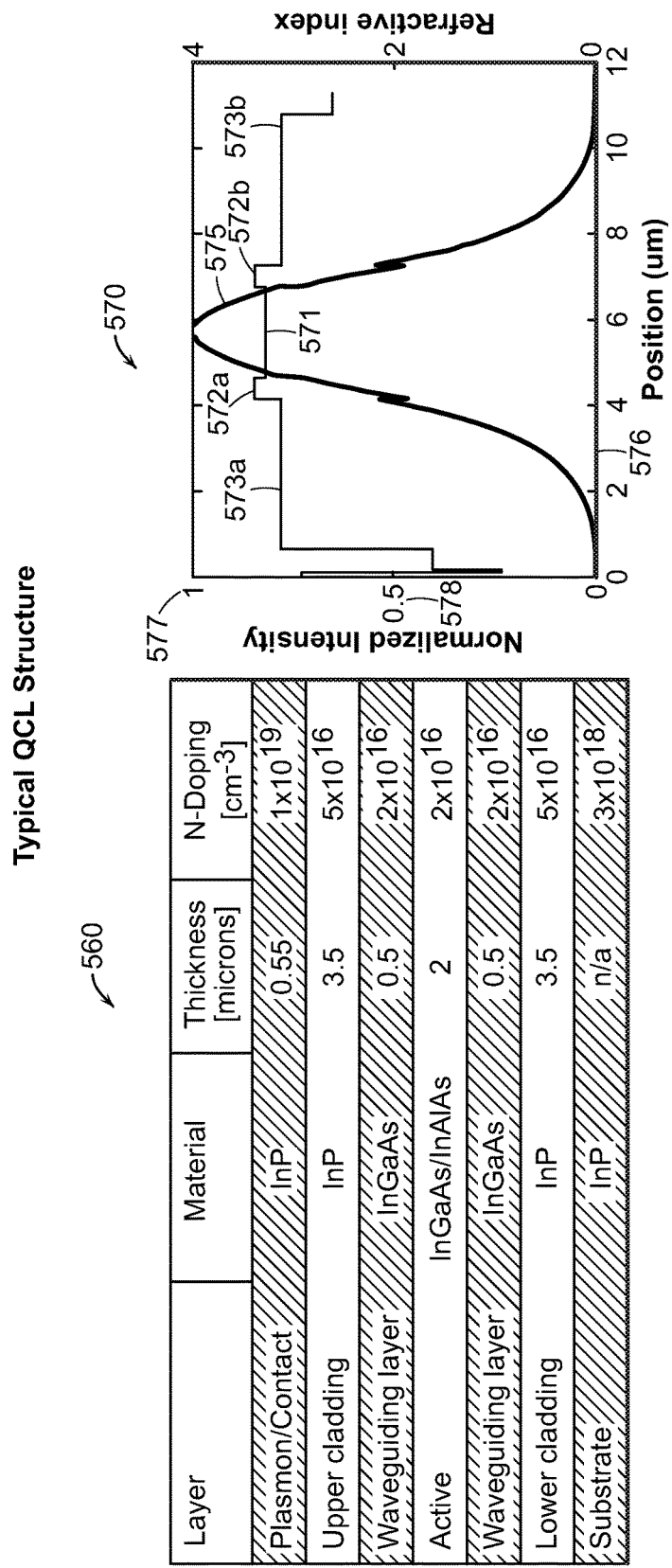
FIG. 5 shows a structure of a typical Indium phosphide-based quantum cascade laser structure that is grown on n-type Indium phosphide, and optical mode is plotted.

FIG. 5 shows a table 560 and graph 570 indicating the structure and refractive indices of a typical InP-based QC structure that is grown on n-type InP. The active region typically consists of a superlattice of alternating layers of InGaAs and InAlAs. A fraction of the layers that comprise the superlattice are doped n-type such that the average free-carrier concentration in the QC layer is on the order of $10^{16}$ cm$^{-3}$. A representative thickness of the QC layer is 2 µm. On either side of the QC layer are 0.5 µm-thick InGaAs waveguiding layers that are included in this example structure to engineer the size of the optical mode. These InGaAs waveguiding layers need not be included in other embodiments. N-type InP cladding layers that are roughly 3.5 µm-thick surround the active region and InGaAs waveguiding layers. The cladding layers are typically doped n-type in the density range $10^{16}$-$10^{17}$ cm$^{-3}$. Towards the surface, above the upper cladding, heavily doped n-type layers serve as plasmon confinement and contact layers. The doping in these layers is typically >$5\times10^{18}$ cm$^{-3}$.

Also included in FIG. 5 is a graph 560 showing the optical mode 575 corresponding to this example QC structure at a wavelength of 9 µm. The optical mode 575 is concentrated in the QC layer 571, waveguiding layers 572a and 572b, and the regions of the cladding layers 573a and 573b that are closest to the QC layer 571. It should be noted that it may be possible to use the substrate as a portion of the lower cladding, especially if its doping is consistent with low optical losses.

The peak normalized intensity 577 of the optical mode 575 is 1.0, while the half-peak intensity 578 is 0.5. A wave confinement includes the center of the optical mode 575 extending outward to the positions where the intensity drops to 50%.

Figure 6:
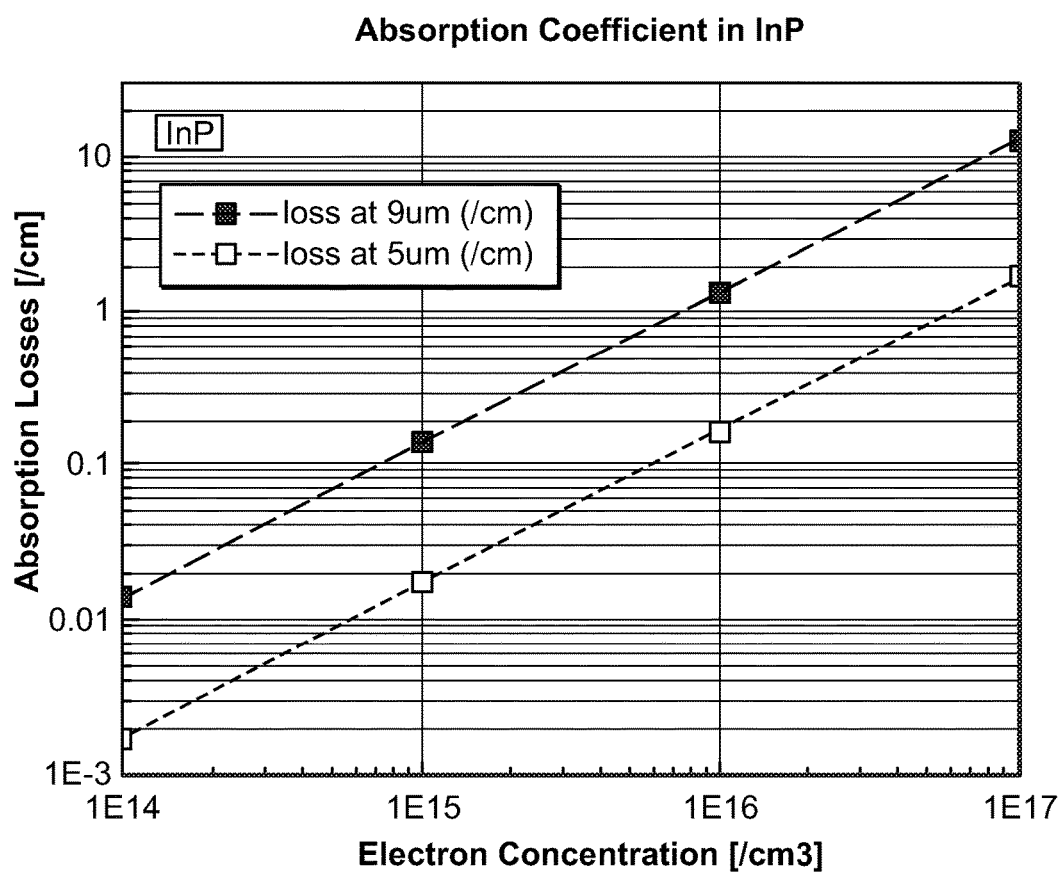
FIG. 6 is a graph plotting calculated absorption coefficients in Indium phosphide as a function of electron concentration for two wavelengths.

FIG. 6 is a graph plotting the calculated absorption coefficient in InP versus electron concentration for the two wavelengths 5 µm and 9 µm. If the electron concentration in the optical waveguide can be made <$10^{15}$ cm$^{-3}$, then the absorption coefficient of those layers will be <0.02 cm$^{-1}$ and <0.2 cm$^{-1}$ for the wavelengths 5 µm and 9 µm, respectively. Even lower carrier concentrations are desirable to achieve even lower losses.

Note that as used in this application, "passive" or "optically" passive indicates that loss is significantly below the loss that would be incurred in an "active" portion of a QC structure having a density of free charge carriers high enough to produce gain in the QC layer. For example, absorption coefficients 0.02 cm$^{-1}$ and <0.2 cm$^{-1}$ for the wavelengths 5 µm and 9 µm, respectively, shown in FIG. 5 are example absorption coefficients that qualify a portion to be considered "passive," and even higher absorption coefficients can qualify.

Since the passive waveguides are to have as low loss as possible, all sources of optical loss should be minimized below the levels that are generally considered acceptable for the QC structures themselves. This involves the following considerations:

a) The implantation process should significantly reduce the mobile carrier concentration in the QC layer and any surrounding waveguiding and cladding layers, particularly the layers within the wave confinement region. A reduction in carrier concentration by >10x, to the range <$10^{15}$ cm$^{-3}$, may be sufficient for most purposes. It is especially important to reduce the carrier concentration in the QC layer because the loss there is due to both inter-subband and free-carrier absorption, with inter-subband absorption having the potential for being larger than free-carrier absorption. Since both of these are proportional to the free-carrier concentration, reducing the free-carrier concentration in the QC layer will reduce both absorption mechanisms.

b) Free-carrier absorption in the substrate must be minimized if the lowest possible absorption is desired, as this absorption can result in significant loss within the context of low-loss passive waveguides. This can be achieved, for example, by growing the QC structure on a low-doped substrate, increasing the thickness of the lower cladding layer, or through a combination of these two approaches.

c) Loss due to free-carrier absorption in the plasmon/contact layers can also be significant since these layers are heavily doped. It is unlikely that an implantation process can sufficiently reduce the carrier concentration in these layers. Therefore, in embodiments requiring very low loss in passive portions of the multi-layer structure, the Plasmon and/or contact layer can be removed by etching them away, for example, in an intended passive portion of the structure. In cases in which these layers are removed, they can be replaced by a low-loss film such as a low-loss dielectric material. The film (such as $SiO_2$, $SiN_x$, $YF_3$, InP, etc.) can consist of a material that has low losses at the wavelengths of interest and that can be easily deposited using methods known in the art (such as material re-growth, electron-beam deposition, sputtering, chemical vapor deposition, and so forth).

d) Masking of the active portions of the chip to protect these portions from being implanted can be achieved in different ways. It can involve depositing masking layers onto the chip itself (for example, using photoresist, metals, dielectrics, or combinations thereof) or patterned masks that are placed in proximity of the chip during the implantation process. The advantage of proximity masks is that they can be relatively thick (>10 μm.) and provide efficient masking against the high energy (MeV-class) implantations that may be necessary. A drawback of proximity masks is that they likely cannot be defined and aligned to the chip with the precision of deposited masks that are enabled by standard semiconductor photolithographic techniques.

FIGS. 7A-7D show four example processing sequences for multi-layer quantum cascade structures with active and passive portions. Each of the four example processing sequences includes two corresponding cross-sectional views illustrating the multi-layer structures at different stages of processing. The multi-layer QC structures in these examples include a substrate layer 616, a lower cladding layer 615, an active (or quantum cascade) layer 613, an upper cladding layer 614, and a plasmon/contact layer 617. The "active portion" of the multi-layer structure is the portion configured to be operable as an optically active quantum cascade device (current can flow through the QC structure and provide optical gain for the waveguide mode). Note that during operation, the current flowing in the active portion of the device does not necessarily need to be in a current range in which the QCL gain medium provides gain. For certain applications or devices, this current can have a lower value at which the structure does not provide gain. The current level can, however, be large enough to provide enough Joule heating resulting in a useful increase of temperature in the device. Thus, the active portion of the multi-layer structure, which is capable of producing gain, can be operated as active device even if current is below a gain threshold. The "passive portion" of the multi-layer structure is characterized by the portion configured to be operable as an optically passive low-loss waveguide or other passive device. The layers in the "passive portion" of the structures need not be perfectly optically passive, but rather only substantially optically passive such that there is a low level of loss. In the passive portions, the structure is substantially non-conductive such that current cannot flow through the QCL structure.

Example Process #1: Single-Schedule Proton Implantation

Figure 7A:
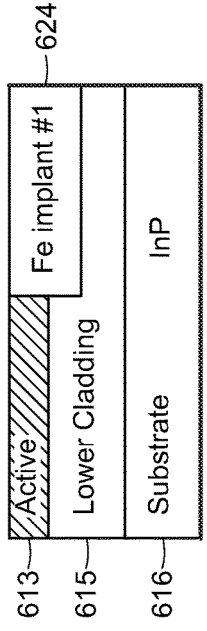
FIGS. 7A-D show example processing sequences and corresponding schematic diagrams for quantum cascade structures with active and passive portions.
Figure 7A:

An example of a processing sequence that involves a single implantation schedule of proton implantation is described. As shown in FIG. 7A, #1, after growth of the completed QC epitaxial structure and after any high-temperature process such as material re-growth to create buried heterostructure devices, the plasmon/contact layer 617 is etched away in the passive portion of the structure, and a schedule of proton implantation is executed in the passive portion of the multi-layer structure intended to become a passive waveguide. In other embodiments, the Plasmon/contact layers are not removed. Since protons can be implanted very deeply, the optical waveguide can substantially be converted to have low loss through the depletion of electronic carriers.

Alternatively, the implantation schedule can proceed with the plasmon/contact layers intact, but then these layers can be removed during a subsequent etching process. In other embodiments, the Plasmon/contact layer is not removed at all. In embodiments in which it is removed, a low-loss dielectric material, for example, may then be deposited onto the implanted region to shield the optical mode from losses at the surface. At this point, additional processing steps such as device bonding can take place provided their processing temperature does not anneal out the defects caused by the proton implantation and thereby significantly increase the carrier concentration in these layers.

Example Process #2: Multiple-Schedule Fe Implantation

Figure 7B:
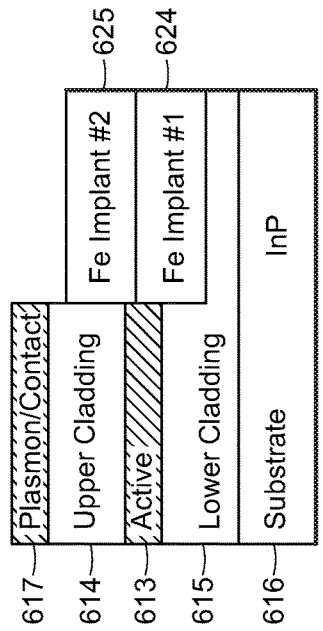
Figure 7B:
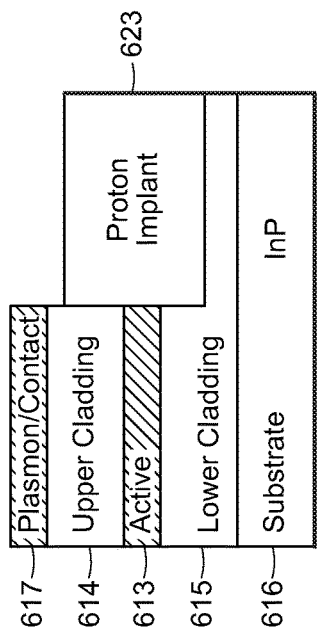

A second example process sequence, shown in FIG. 7B, involves multiple-schedule Fe implantation. Multiple-schedule Fe implantations may be necessary because of the limited implantation depths that are possible with Fe, as illustrated in FIGS. 3 and 4. For 10 MeV implants, for example, the penetration depth is ~4 μm, whereas the QC structure has a thickness of ~10 μm.

In process sequence #2, the QC epitaxial material is grown up through the QC layer. Prior to growing the upper cladding layer 614, and the plasmon/contact layer 617, a first Fe implantation schedule 621, Fe Implant #1, is performed where the passive waveguide will be fabricated in the passive portion of the structure. Fe ions are implanted into the active and lower cladding layers 613 and 615, respectively, where the passive waveguide will be fabricated in the passive portion of the structure. After Fe Implant #1, the upper layers 614 and 617 are grown, and then the the plasmon/contact layer 617 is etched away in the passive portion of the structure, and the second Fe implant schedule 625, Fe Implant #2, is performed.

The Fe that was deposited using the first implantation schedule 624 will be at least partially activated through incorporation into the crystal lattice during the high-temperature re-growth step. The Fe ions deposited during the second implantation schedule 625 must be thermally annealed in a process step to activate these ions. This annealing step could take place during a second re-growth step of Iron-doped Indium phosphide (Fe:InP) to create buried heterostructure (BH) QC structures or in a dedicated annealing step. Fabrication of the MIR PIC can continue using standard fabrication methods. As in Example Process #1, it may be desirable to deposit a low-loss dielectric above the implanted regions to shield the optical mode from losses at the surface.

Although only two implantation schedules are described in process sequence #1, other processes can include three or more implantation schedules. It may be necessary to carry out multiple implantation schedules depending upon the thicknesses of the epitaxial layers that comprise the QC structure. Also, it should be noted that structures such as buried gratings may be required for QC structure fabrication for certain devices such as DFB QCLs or filters, for example. At the time of the first implantation schedule, when the semiconductor material that is close to the QC layer is exposed to ion implantation, etching of buried gratings and other such structures can be performed as necessary.

Example Process #3: Fe Implantation Plus Fe:InP Re-Growth

Figure 7C:
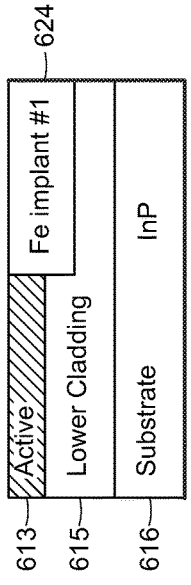
Figure 7C:
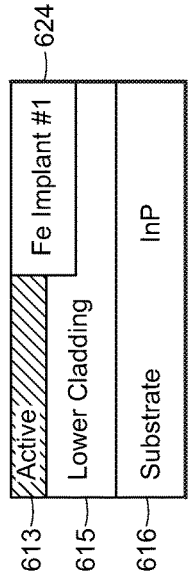

A third example process sequence, shown in FIG. 7C, involves an Fe implantation schedule 624 and subsequent re-growth 626 of Fe:InP upper cladding layers. Example Process #3 is similar to Example Process #2 in that the QC epitaxial material is grown up through the active layer 613, but prior to growing the upper cladding layer 614. In the passive portion of the structure, where the passive waveguide will be fabricated, a first Fe implantation schedule 624 is performed to deposit Fe ions into the active and lower cladding layers 613 and 615, respectively, in the passive portion of the structure. Then the upper cladding 614 for the QC structure is re-grown. In the passive portion of the structure corresponding to passive waveguide, these active and lower cladding layers 613 and 615 are removed and Fe:InP 626 is re-grown to serve as the upper cladding in the passive portion of the structure. Since the plasmon/contact layer 617 is not re-grown in the passive portion during this step, there is no need for an etching step to remove it. Nevertheless, as with Example Process #1, it a low-loss dielectric can optionally be deposited above the re-grown Fe:InP 626 upper cladding to shield the optical mode from losses at the structure surface. Fabrication of the MIR PIC can then continue using standard fabrication methods.

It should be noted that this Fe:InP re-growth step can be dedicated for re-growth of the upper cladding of the passive waveguides. However, it may also be possible to simultaneously create BH devices in which the Fe:InP (which serves as the upper cladding of the passive waveguides) is also re-grown on the sidewalls of the ridges that form the lateral waveguides for both the active and passive devices.

Example Process #4: Fe Implantation Plus Proton Implantation

Figure 7D:
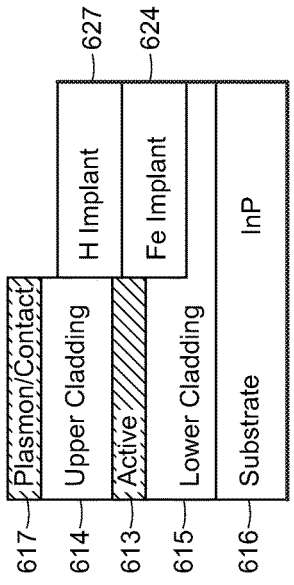
Figure 7D:
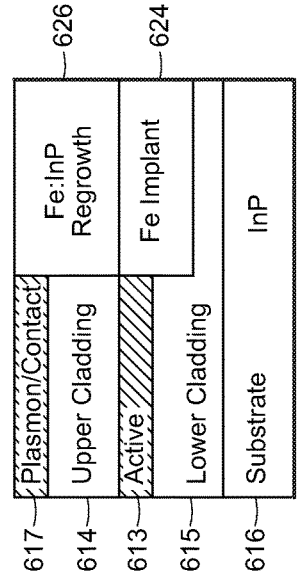

A fourth example process sequence, shown in FIG. 7D, involves both Fe and proton implantation. Example Process #4 is similar to Example Process #2 in that the QC epitaxial material is grown up through the active layer 613, but implantation is performed prior to completing growth of the upper cladding layer 614. In the passive portion of the structure, where a passive waveguide will be fabricated, a first Fe implantation schedule 624 is performed to deposit Fe ions into the active and lower-cladding layers 613 and 615, respectively. Then the upper layers 614 and 617 are re-grown and the plasmon/contact layer 617 is etched away in the passive portion of the structure. Following the etching, protons are implanted into the upper cladding layer 614 to convert the layer into low-loss material in the passive portion of the structure. In other embodiments, it is desirable to implant protons through the entire waveguiding region, extending into the lower cladding. The implantation of protons must occur after any high-temperature steps in the process.

One purpose of including Example Process #4 is to illustrate that different ions can be used at different stages of embodiment processes to facilitate fabrication of low-loss waveguides.
Expected Performance Optical loss calculations have been performed for structures that have been converted into passive waveguides using the Example Processes #1-#4 described above. These optical loss calculations indicate that the loss can be low enough for practical applications. For QC devices operating at $\lambda \sim 5$ μm, the modal absorption coefficient due to free-carrier absorption in the active portion is calculated to be on the order of $\sim 1$ cm$^{-1}$. After conversion to a passive low-loss waveguide, the calculated losses are <0.03 cm$^{-1}$ assuming that the residual free-carrier concentration in the implanted regions is <$10^{15}$ cm$^{-3}$. These calculations imply an 85% power transmission through a 5-cm-long waveguide. Even lower free-carrier concentrations are expected based on the results presented in [Semtsiv et al., IEEE J. of Quantum Electron. 42, 490 (2006)] for proton implantation.

At longer wavelengths, the waveguide losses will be higher because of the larger optical mode size and also because of the strong increase in free-carrier absorption with wavelength as shown in FIG. 6. For a wavelength of $\lambda=9$ calculations indicate that the modal waveguide loss in passive low-loss waveguides based on typical QC structures can be <0.5 cm$^{-1}$. These loss levels, although higher than at $\lambda=5$ μm, would still enable a wide variety of MIR PICs.

Embodiments of the invention are not limited to depleting a waveguiding region of a QC structure of free charge carriers to render the region passive. Semiconductors having a QC-type structure can initially be formed to be devoid of free charge carriers. Ion implantation, for example, can be used to increase a density of free charge carriers in a portion intended to become active. Thus, a device with a QC structure can initially be configured to be passive and be operable, for example as a waveguide or another of the passive devices described above. Subsequently, a region of the QC structure such as a region of a QC layer in a semiconductor can be subjected to ion implantation using ion species such as those described above to enhance a density of free carriers to create a gain medium for a laser, an amplifier, or other active QC device.

Furthermore, embodiments are not limited to QC-based PICs including both active and passive devices. Methods, and corresponding devices, can include initially forming a QC-based structure to be passive or active, based on an initial density of free charge carriers, as described above. However, a portion of the QC structure may be substantially modified to make the portion capable of a different degree of gain or loss. For example, two active devices such as a QC laser and a QC amplifier may be optimized with two different densities of free charge carriers or two different degrees of optical gain. Thus, two active devices such as the QC laser 101 and the QC amplifier 111 shown in FIG. 2A may be monolithically integrated by initially forming a QC structure to be capable of producing a particular gain reflecting a need for one of the devices. Afterwards, ion implantation, for example, may be used in a portion of the QC structure to either increase or decrease the density of free charge carriers in the portion of the structure intended to be operable for the other device.

While this invention has been particularly shown and described with references to example embodiments thereof, it will be understood by those skilled in the art that various changes in form and details may be made therein without departing from the scope of the invention encompassed by the appended claims.

What is claimed is:
1. A method comprising:
   forming an integrated multi-layer semiconductor structure including a wave confinement region comprising a quantum cascade layer, the quantum cascade layer within the wave confinement region having a density of free charge carriers sufficient to produce optical gain in the quantum cascade layer in a wavelength spectrum; and configuring a portion of the wave confinement region to be a passive portion by substantially depleting the quantum cascade layer within the portion of the wave confinement region of free charge carriers to have low loss in the wavelength spectrum, a remaining portion of the wave confinement region other than the passive portion comprising an active portion of the wave confinement region.

2. The method of claim 1, wherein substantially depleting the quantum cascade layer within the portion of the wave confinement region of free charge carriers comprises implanting ions into the layer.

3. The method of claim 2, wherein implanting ions comprises implanting ions of at least one of Hydrogen, Helium, Oxygen, Iron, Chromium, Cobalt, Nickel, Titanium, Vanadium, Silicon, Sulfur, Selenium, Tellurium, Tin, Zinc, and Carbon.

4. The method of claim 1, wherein substantially depleting the quantum cascade layer within the portion of the wave confinement region of free charge carriers comprises depleting the layer to a free charge carrier density less than about $10^{15}$ cm$^{-3}$.

5. The method of claim 4, wherein substantially depleting the quantum cascade layer within the portion of the wave confinement region of free charge carriers further comprises depleting the layer to a free charge carrier density less than about $10^{10}$ cm$^{-3}$.

6. The method of claim 1, wherein the multi-layer structure comprises an active portion and a passive portion, the active portion of the structure comprising the active portion of the wave confinement region, and wherein forming the multi-layer structure comprises configuring the active portion of the structure to include at least one of a laser, a distributed feedback laser, an amplifier, a master-oscillator power amplifier, a switch, a modulator, a phase shifter, and a detector.

7. The method of claim 1, wherein the multi-layer structure comprises an active portion and a passive portion, the passive portion of the structure comprising the passive portion of the wave confinement region, the method further comprising configuring the passive portion of the multi-layer structure to include at least one of a waveguide, a router, a splitter, a combiner, a coupler, a phase shifter, a multiplexer, an interferometer, a filter, a modulator, a switch, and a resonator.

8. The method of claim 1, wherein the wavelength spectrum is in the mid-infrared wavelength region.

9. The method of claim 1, wherein the active portion of the wave confinement region is a first active portion and the density of free charge carriers is a first density, the method further comprising configuring an additional portion of the wave confinement region to be a second active portion by modifying the first density of free charge carriers in the quantum cascade layer within the second active portion of the wave confinement region to be a second density of free charge carriers sufficient to produce optical gain in the quantum cascade layer in the wavelength spectrum, the second density differing from the first density.

10. The method of claim 9, wherein the first active portion is a laser and the second active portion is an amplifier.

11. A method comprising:
forming an integrated multi-layer semiconductor structure including a wave confinement region comprising a quantum cascade layer, the quantum cascade layer being substantially depleted of free charge carriers to have low loss in a wavelength spectrum; and configuring a portion of the wave confinement region to be an active portion by increasing a density of free charge carriers in the quantum cascade layer in the portion of the wave confinement region to a value sufficient to produce optical gain in the quantum cascade layer in the wavelength spectrum, a remaining portion of the wave confinement region other than the active portion comprising a passive portion of the wave confinement region.

12. The method of claim 11, wherein increasing the density of free charge carriers comprises implanting ions into the quantum cascade layer in the portion of the wave confinement region.

13. The method of claim 11, wherein the multi-layer structure comprises an active portion and a passive portion, the passive portion of the structure comprising the passive portion of the wave confinement region, the method further comprising configuring the passive portion of the multi-layer structure to include at least one of a waveguide, a router, a splitter, a combiner, a coupler, a phase shifter, a multiplexer, an interferometer, a filter, a modulator, a switch, and a resonator.

14. The method of claim 11, further comprising configuring an active portion of the multi-layer structure comprising the active portion of the wave confinement region to include at least one of a laser, a distributed feedback laser, an amplifier, a master-oscillator power amplifier, a switch, a modulator, a phase shifter, and a detector.

15. The method of claim 11, wherein the active portion of the wave confinement region is a first active portion and the density of free charge carriers is a first density, the method further comprising configuring an additional portion of the wave confinement region to be a second active portion by increasing the first density in the quantum cascade layer in the second active portion to a second density of free charge carriers sufficient to produce optical gain in the quantum cascade layer in the wavelength spectrum, the second density differing from the first density.

16. The method of claim 15, wherein the first active portion is a laser and the second active portion is an amplifier.

17. The method of claim 11, wherein the wavelength spectrum is in the mid-infrared wavelength region.

* * * * *